(12) United States Patent
Vida et al.

(10) Patent No.: US 11,996,815 B2
(45) Date of Patent: May 28, 2024

(54) TERMINATION IMPEDANCE ISOLATION FOR DIFFERENTIAL TRANSMISSION AND RELATED SYSTEMS, METHODS AND APPARATUSES

(71) Applicant: Microchip Technology Incorporated, Chandler, AZ (US)

(72) Inventors: Steven Vida, Reading, PA (US); David Gammie, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/456,432

(22) Filed: Nov. 24, 2021

(65) Prior Publication Data

US 2022/0166411 A1 May 26, 2022

Related U.S. Application Data (60) Provisional application No. 63/198,962, filed on Nov. 25, 2020.

(51) Int. Cl.
*H03H 11/28* (2006.01)

(52) U.S. Cl.
CPC .................................. *H03H 11/28* (2013.01)

(58) Field of Classification Search
None
See application file for complete search history.

(56) References Cited

U.S. PATENT DOCUMENTS 8,744,378 B2 * 6/2014 Hur ...................... H04B 1/0475
455/114.1
2017/0111081 A1 4/2017 Koch et al.

FOREIGN PATENT DOCUMENTS

EP 3309564 A1 4/2018

OTHER PUBLICATIONS

International Search Report from International Application No. PCT/US2021/072589, dated May 3, 2022, 6 pages.
International Written Opinion from International Application No. PCT/US2021/072589, dated May 3, 2022, 11 pages.

* cited by examiner

*Primary Examiner* — Cassandra F Cox
(74) *Attorney, Agent, or Firm* — TraskBritt (57) ABSTRACT

Disclosed examples include an apparatus. The apparatus may include a differential signal path portion, a first circuit, and a second circuit. The first circuit may be arranged at the differential signal path portion to set a differential impedance of the differential signal path portion. The second circuit may be arranged outside of the differential signal path portion to set a common-mode impedance of the differential signal path portion lower than the differential impedance.

18 Claims, 5 Drawing Sheets

TERMINATION IMPEDANCE ISOLATION FOR DIFFERENTIAL TRANSMISSION AND RELATED SYSTEMS, METHODS AND APPARATUSES

CROSS-REFERENCE TO RELATED APPLICATION

This patent application claims priority to U.S. Provisional Patent Application No. 63/198,962, filed Nov. 25, 2020, and titled FEEDBACK TO SUPPRESS COMMON-MODE TRANSIENTS ON A DIFFERENTIAL TRANSMISSION LINE, the entire disclosure of which is hereby incorporated herein by this reference.

FIELD

One or more examples relate, generally, to electronic communication, and more specifically, to transmission of differential signals for electronic communication. One or more examples relate, generally, to electronic systems, and more specifically, to electronic subsystems having or influenced by different electrical environments within an electronic system.

BACKGROUND

Differential signaling involves sending an electronic signal as a differential pair of signals. A differential pair includes two complementary voltage signals, each on its own conductor. Non-limiting examples of conductors include wires twisted together to form a twisted pair or conductive traces on a circuit board. When initiating transmission of an electronic signal, typically one of the conductors carries the electronic signal and the other conductor carries an inverted version of the electronic signal.

A receiver recovers information from a difference between the signals sensed at the respective conductors (such a difference referred to herein as a "differential signal"). As a non-limiting example, if a non-inverted signal is higher than an inverted signal, that is a logic high or "1," and if a non-inverted signal is lower than an inverted signal, that is a logic low or "0."

Differential signals typically exhibit better resistance to electromagnetic interference (EMI) and crosstalk compared to single-ended signals, where an electronic signal is transmitted on a single conductor and voltage potential on the conductor is compared to a reference voltage to recover the signal. A differential signal may have a lower voltage level than a single-ended signal and maintain a same or better signal-to-noise ratio (SNR) than a comparable single-ended signal.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure, but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

In this disclosure, when an element (e.g., a circuit, electronic device, or electrical component without limitation) is described as having an "impedance," that should be understood to refer to an electrical impedance of an element.

In theory, a differential pair of signals are "balanced" in that they should have equal amplitude and opposite polarity relative to a common-mode voltage, and so return currents associated with these voltages should also be balanced and cancel each other out, so an idealized differential transmission system has zero current flowing to a ground connection and so different ground potentials may be used at a sender and a receiver.

The inventors of this disclosure appreciate that it would be desirable to maintain a low common-mode impedance to suppress common-mode transients. The inventors of this disclosure appreciate that it would be desirable to include a number of electronic subsystems in an electronic system where the electronic subsystems can operate and/or behave independently, that is, have different operating ranges and/or exposure to different electrical environments without negatively influencing each other.

Figure 1:
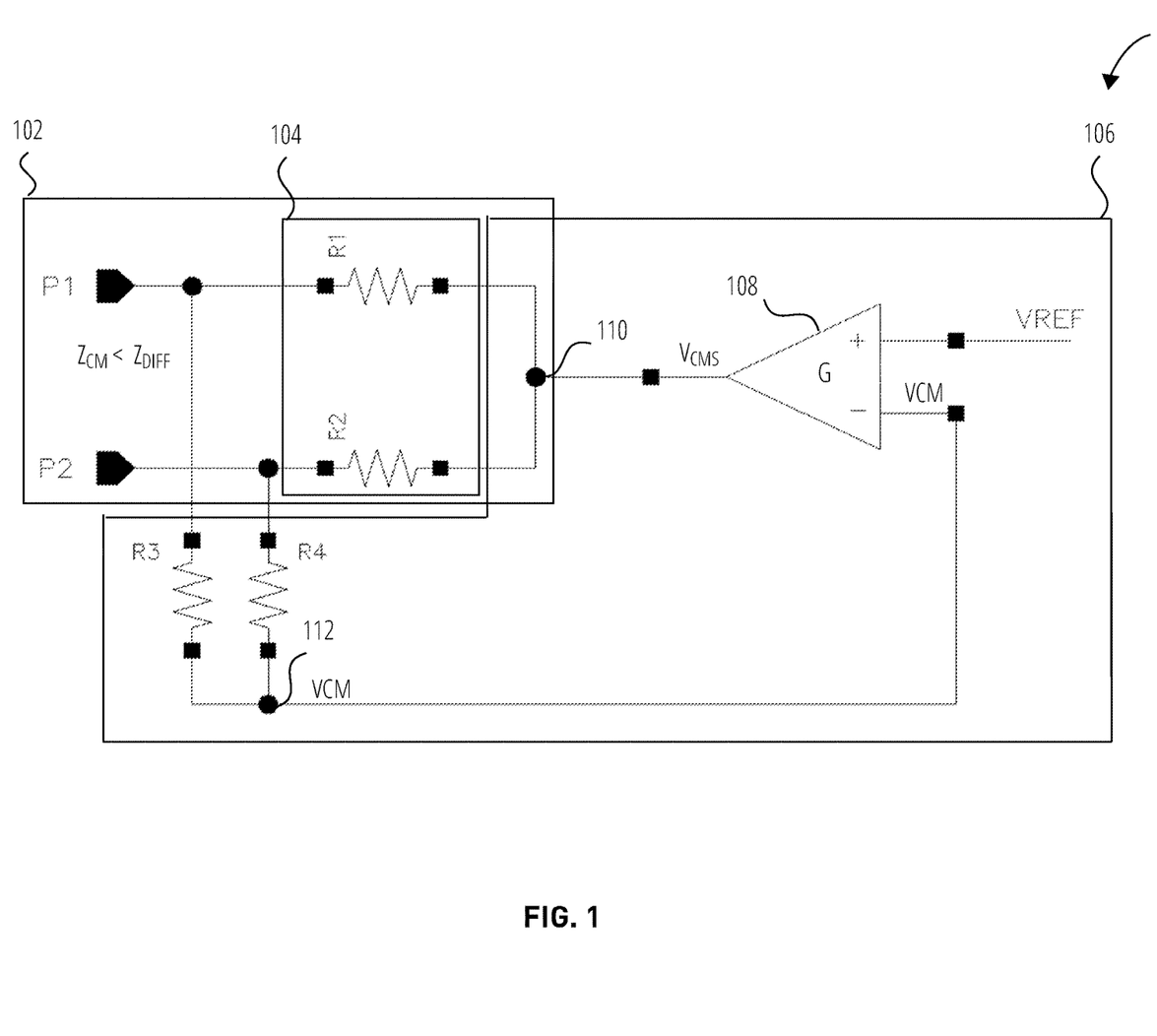
FIG. 1 is a schematic diagram depicting an apparatus configured as a common-mode impedance isolator of a receiver of a differential transmission system, in accordance with one or more examples.

FIG. 1 is a schematic diagram depicting an apparatus 100 configured as a common-mode impedance isolator (also referred to herein as "common-mode impedance isolator 100") in accordance with one or more examples. In various examples, common-mode impedance isolator 100 may be utilized by, or included with, a receiver of a differential transmission system to reduce (or set lower) common-mode impedance at terminals P1 and P2 as discussed below.

Common-mode impedance isolator 100 may include a differential signal path portion 102, a first circuit 104, and a second circuit 106. Differential signal path portion 102 may include terminals P1 and P2 and a terminating node 110. First circuit 104 may include a pair of resistors R1 and R2. Optionally, differential signal path portion 102 may include first circuit 104. Second circuit 106 may include a pair of resistors R3 and R4, a sensing node 112, and an amplifier (amp) 108.

In one or more examples, first circuit 104 is to drive voltage at terminals P1 and P2 suitable for reading a differential signal. In the specific non-limiting example depicted by FIG. 1, resistor R1 of first circuit 104 is coupled between terminal P1 and terminating node 110 (forming a first component portion) to provide an impedance there between, and resistor R2 of first circuit 104 is coupled between terminal P2 and terminating node 110 (forming a second component portion) to provide an impedance there between.

In one or more examples, resistors R3/R4 of second circuit 106 are to sense a common-mode voltage $V_{CM}$ to sensing node 112. Resistor R3 is coupled between terminal P1 and sensing node 112, and resistor R4 is coupled between terminal P2 and sensing node 112. An output of amp 108 of second circuit 106 is coupled to terminating node 110, an inverting input of amp 108 is coupled to receive a voltage at sensing node 112 (i.e., a sensed voltage, the common-mode voltage $V_{CM}$) and a non-inverting input of amp 108 is coupled to receive a reference voltage $V_{REF}$.

A differential impedance $Z_{DIFF}$ into terminals P1/P2 is set, at least in part, by resistors R1/R2, which set to be a suitable impedance value such that a differential signal may be read at terminals P1/P2. As a non-limiting example, differential impedance $Z_{DIFF}$ may be set to a value (via resistance values of resistors R1/R2) such that respective voltages at terminals P1 and P2 are within an operational range of a receiver (receiver not depicted), such as voltage rails of an integrated circuit.

A common-mode impedance $Z_{CM}$ seen at terminals P1/P2 is set via second circuit 106 (also referred to herein as "feedback circuit 106"). In one or more examples, common-mode impedance $Z_{CM}$ is controlled by shorting terminals P1/P2 via resistors R3/R4 to sensing node 112, and a resultant value for common-mode impedance $Z_{CM}$ measured from sensing node 112 to ground. In one or more examples, sensing node 112 is at a location that is outside (i.e., physically or electrically remote from) differential signal path portion 102, as depicted by FIG. 1.

Common-mode voltage $V_{CM}$ is sensed to sensing node 112 via resistors R3/R4, and sensing node 112 is coupled to the inverting input of amp 108. Amp 108 generates a common-mode suppression voltage $V_{CMS}$ at least partially responsive to reference voltage $V_{REF}$ and sensed common-mode voltage $V_{CM}$. Amp 108 is to generate common-mode suppression voltage $V_{CMS}$ at least partially responsive to (e.g., to reduce, without limitation) a difference between common-mode voltage $V_{CM}$ and reference voltage $V_{REF}$. In other words, feedback circuit 106 drives common-mode voltage $V_{CM}$ to track reference voltage $V_{REF}$.

During a contemplated operation of common-mode impedance isolator 100, as common-mode voltage $V_{CM}$ decreases, the common-mode impedance $Z_{CM}$ seen at terminals P1/P2 also decreases. Accordingly, the common-mode impedance $Z_{CM}$ seen at terminals P1/P2 may change at least partially responsive to a change in common-mode voltage $V_{CM}$ and, accordingly, may change at least partially responsive to a change in common-mode suppression voltage $V_{CMS}$.

In one or more examples, a contribution to common-mode impedance $Z_{CM}$ by respective resistance values of resistors R3 and R4 and amp 108 may be smaller, even much smaller, than a contribution to the differential impedance $Z_{DIFF}$ since common-mode suppression voltage $V_{CMS}$ is at least partially based on a gain G of amp 108. The greater the gain G of amp 108 then the smaller the contribution to common-mode impedance $Z_{CM}$ by resistors R3 and R4 (and optionally the contribution, if any, by resistors R1 and R2) may be.

When common-mode impedance $Z_{CM}$ is lower than differential impedance $Z_{DIFF}$, a read signal present at terminals P1/P2 is not influenced, or at least is negligibly influenced, by a common-mode signal (or at least a suppressed portion of a common-mode signal, such as a portion that corresponds to common-mode transients, without limitation).

In the specific non-limiting example depicted by FIG. 1, the common-mode voltage $V_{CM}$ at sensing node 112 is sensed at an inverting input of amp 108 and a reference voltage, $V_{REF}$, is sensed at a non-inverting input of amp 108. Amp 108 generates an output voltage (i.e., $V_{CMS}$) that, when applied to terminating node 110, has a voltage level suitable to drive a voltage level at sensing node 112 toward, and eventually substantially to, a voltage level of reference voltage $V_{REF}$. In various examples, reference voltage $V_{REF}$ may be selected to have a voltage level substantially equal to a mid-point of an operating voltage range of the transmission system. This enables a largest operating range for differential signals in the transmission system.

In one or more examples, the voltage level of reference voltage $V_{REF}$ is substantially the same as a voltage level of a reference voltage generated by a receiver. In one or more examples, the voltage level of reference voltage $V_{REF}$ is set to be in the center of the operating range of the receiver to be, as a non-limiting example, equally different than voltage rails of the receiver to enable a wide range for a differential signal without clipping of the differential signal. In one or more examples, when the voltage level at sensing node 112 is substantially equal to the reference voltage $V_{REF}$, typically a full operating range may be realized for the differential signal.

In the specific non-limiting example depicted by FIG. 1, differential impedance $Z_{DIFF}$ is directly implemented by respective impedances of resistors R1/R2. In various examples, resistance values for resistors R3/R4 are larger than the resistance values of resistors R1/R2. Since resistors R1/R2 and resistors R3/R4 are arranged in parallel, if resistors R3/R4>>resistors R1/R2, then resistors R1/R2 are the primary contributors to the termination impedance $Z_T$ or terminals P1 and P2, and accordingly, differential impedance $Z_{DIFF}$ is the primary contributor (between $Z_{DIFF}$ and $Z_{CM}$) to termination impedance $Z_T$.

In one or more examples, resistors R3/R4 have resistance values that are set to be substantially balanced (i.e., R3=R4) and much larger that than resistance values of resistors R1/R2. (i.e., suitably larger to reduce or limit influence on termination impedance into terminals P1/P2). In one or more examples, resistance values of resistors R1/R2 may also be set to be substantially balanced (i.e., R1=R2) and much smaller than resistance values of resistors R3/R4.

Figure 2:
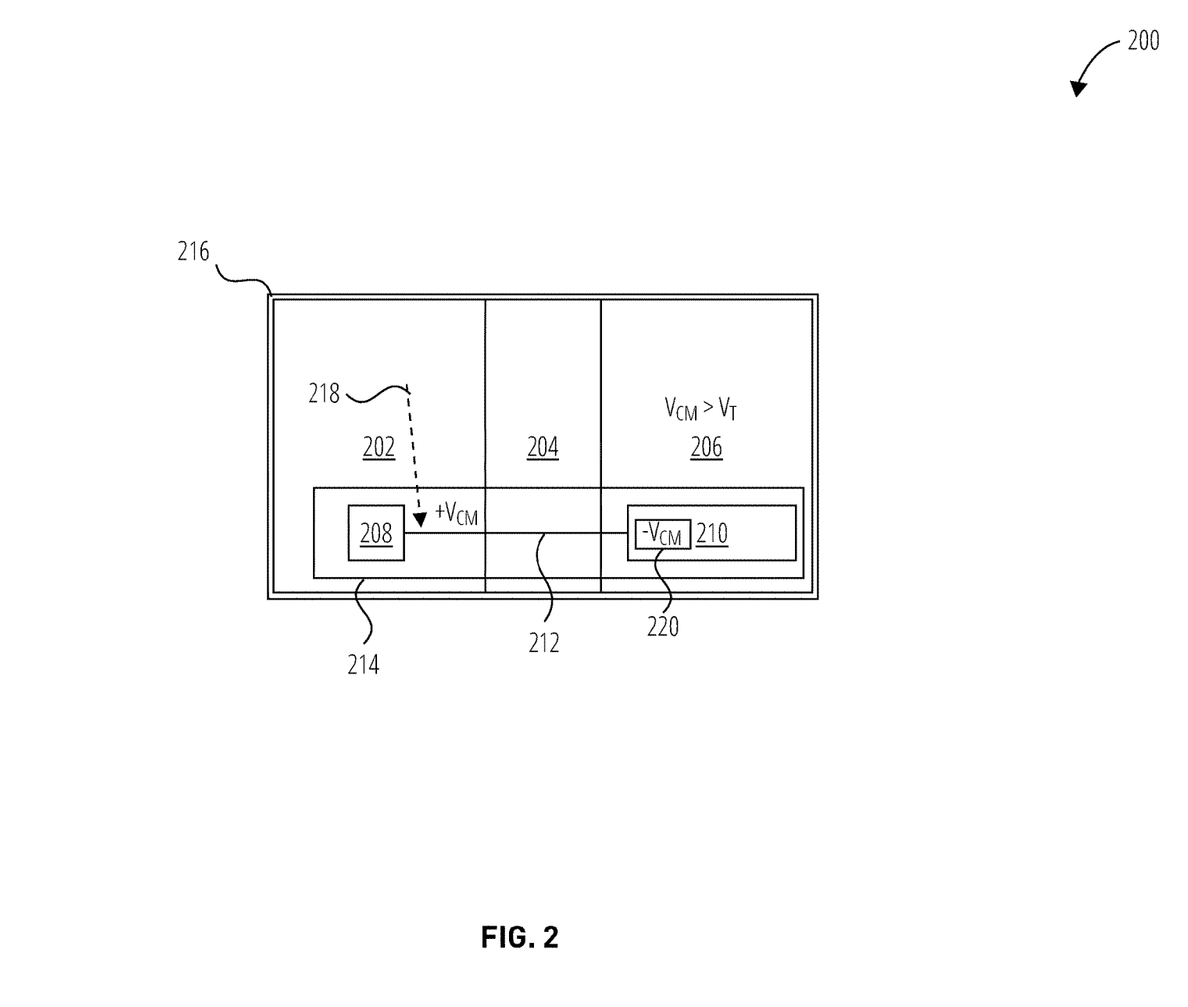
FIG. 2 is a schematic diagram depicting an electronic system, in accordance with one or more examples.

FIG. 2 is a schematic diagram depicting an electronic system 200 that includes first electronic subsystem 202 and second electronic subsystem 206 arranged on a support structure 216, implemented as a non-limiting example, by a printed circuit board or a microelectronic device. First electronic subsystem 202 and second electronic subsystem 206 are electrically isolated by first isolator 204 such that these subsystems may operate independently in their respective environments. More specifically, first isolator 204 reduces the influence of respective electrical environments of the first or second subsystems 202/206 on each other. First isolator 204 may be or include, as non-limiting examples, an isolation material or isolation circuit.

In the specific non-limiting example depicted by FIG. 2, either or both of first and second electronic subsystems 202/204 may include circuitry that experiences common-mode transient events that affect differential transmission medium 212 of differential transmission system 214. As example only, first electronic subsystem 202 may include a high speed current switching using microelectronic devices such as insulated-gate bipolar transistors or field-effect transistors implemented using silicon-carbide (SiC), without limitation. The extent of the transition period from ON to OFF or OFF to ON at such microelectronic devices can cause voltage spikes, which spike is higher the shorter the transition period of such devices. Stated another way, the faster the switching speed, the higher the voltage spikes that may be exhibited by such devices. Common-mode transient events 218 (e.g., voltage spikes discussed above, without limitation) may induce an increase in common-mode voltage (+$V_{CM}$) at differential transmission medium 212.

Continuing with the example where first electronic subsystem 202 includes circuitry that experiences common-mode transient events 218, receiver 210 may include a second isolator 220 to reduce the influence of the electrical environment of first electronic subsystem 202 (for example only, on a signal transmitted by differential transmission system 214). Common-mode transient events 218 are sufficient to increase the noise signal (e.g., +$V_{CM}$, without limitation) at the differential transmission medium 212 above a threshold (i.e., $V_{CM} > V_T$) of the second electronic subsystem.

Receiver 210 may include a second isolator 220 (e.g., a common-mode impedance isolator 100 of FIG. 1, without limitation) to enable reading of a differential signal transmitted on differential transmission medium 212 by transmitter 208 that may be affected by common-mode transient events 218, without reading some or all unwanted noise on differential transmission medium 212.

Figure 3:
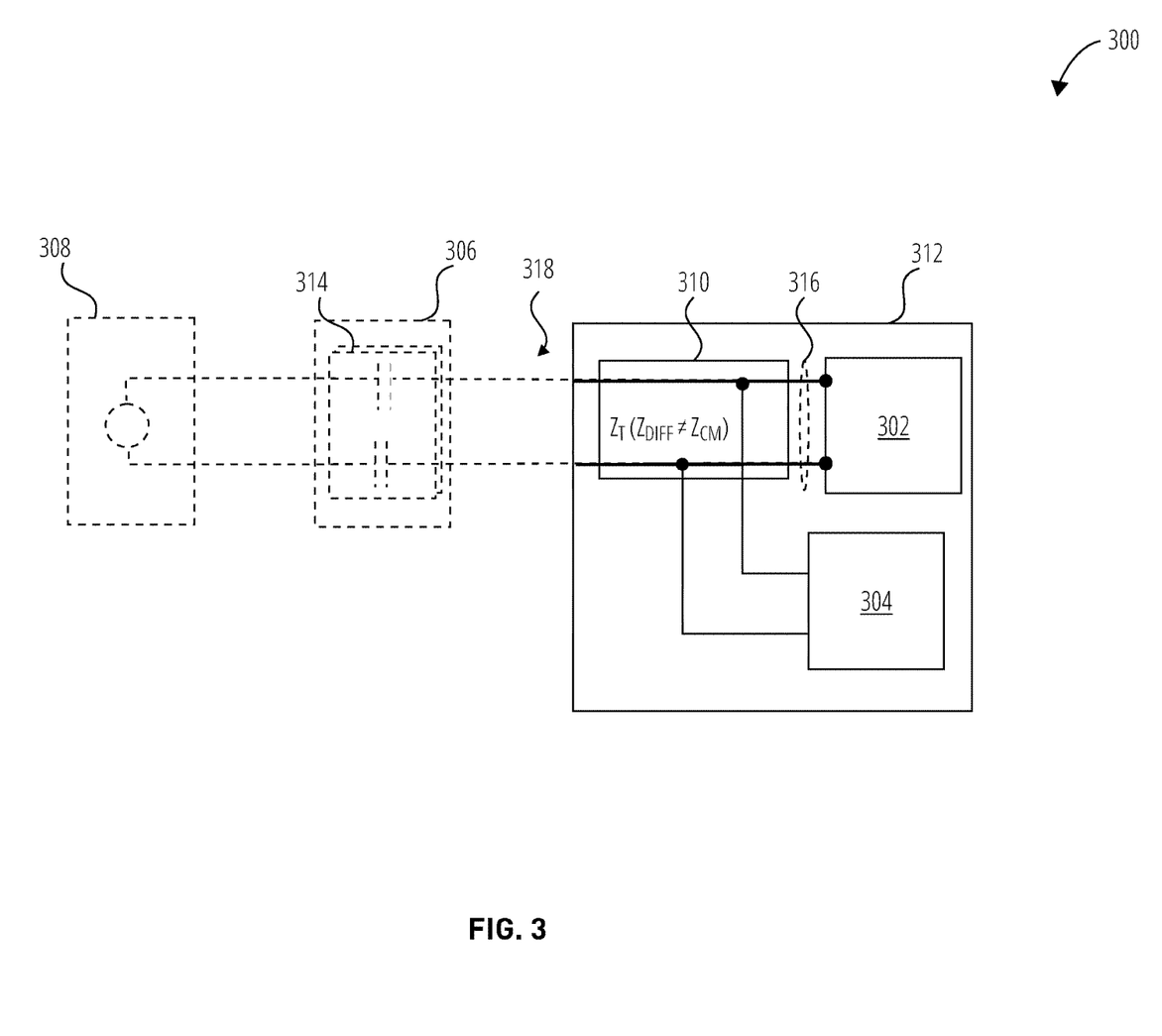
FIG. 3 is a schematic diagram depicting a differential transmission system, in accordance with one or more examples.

FIG. 3 is a schematic diagram depicting a system 300 configured as a differential transmission system (also referred to herein as "differential transmission system 300"), in accordance with one or more examples. Differential transmission system 300 is a specific non-limiting example of a differential transmission system 214 of FIG. 2. Differential transmission system 300 may include a receiver 312, and, optionally, a transmitter 308 and an isolator 306. Receiver 312 may include or be coupled with a terminating portion 310 of a differential transmission line 318 (such as a differential transmission line coupled to transmitter 308 via isolator 306), a differential detector 302, and an impedance isolator 304.

In various examples, transmitter 308 and receiver 312 may be located in different electronic subsystems that operate in or under the influence of different electrical environments, such as subsystems 202 and 206 of FIG. 2, without limitation. Such electronic subsystems are at least partially isolated (e.g., from influence of electrical environments of the other subsystem, without limitation) by isolator 306. Signal coupler 314 to provide capacitive and/or inductive signal coupling (in the specific non-limiting example depicted by FIG. 3, a capacitive signal coupler, without limitation) forms a portion of the differential transmission medium located at an isolator 306, which differential transmission medium communicatively couples transmitter 308 and receiver 312.

Such a transmission medium may include combinations and subcombinations of wired and unwired path. Such paths may include, as non-limiting examples, any combination and sub-combination of conductors (e.g., wires and traces, without limitation) and signal couplers (e.g., capacitive couplers and inductive couplers, without limitation). In the specific non-limiting example depicted by FIG. 3, one or more signal couplers 314 may facilitate communication across a region of isolator 306, and more specifically, facilitate transmission of signals among circuits of transmitter 308, receiver 312, or isolator 306. In one or more examples, electronic components of a signal coupler 314 may be located at or near a region of the isolator.

Receiver 312 may include a differential detector 302 coupled to measure a differential signal 316 at terminals of terminating portion 310 of the differential transmission medium. Receiver 312 may include impedance isolator 304 (such as common-mode impedance isolator 100, without limitation) arranged to isolate a differential impedance $Z_{DIFF}$ and a common-mode impedance $Z_{CM}$, and more specifically, reduce a common-mode $Z_{CM}$ impedance at terminals of terminating portion 310 relative to a differential impedance $Z_{DIFF}$ at terminals of terminating portion 310, as discussed herein. Common-mode impedance isolator 100 is a non-limiting example of an impedance isolator 304.

Figure 4:
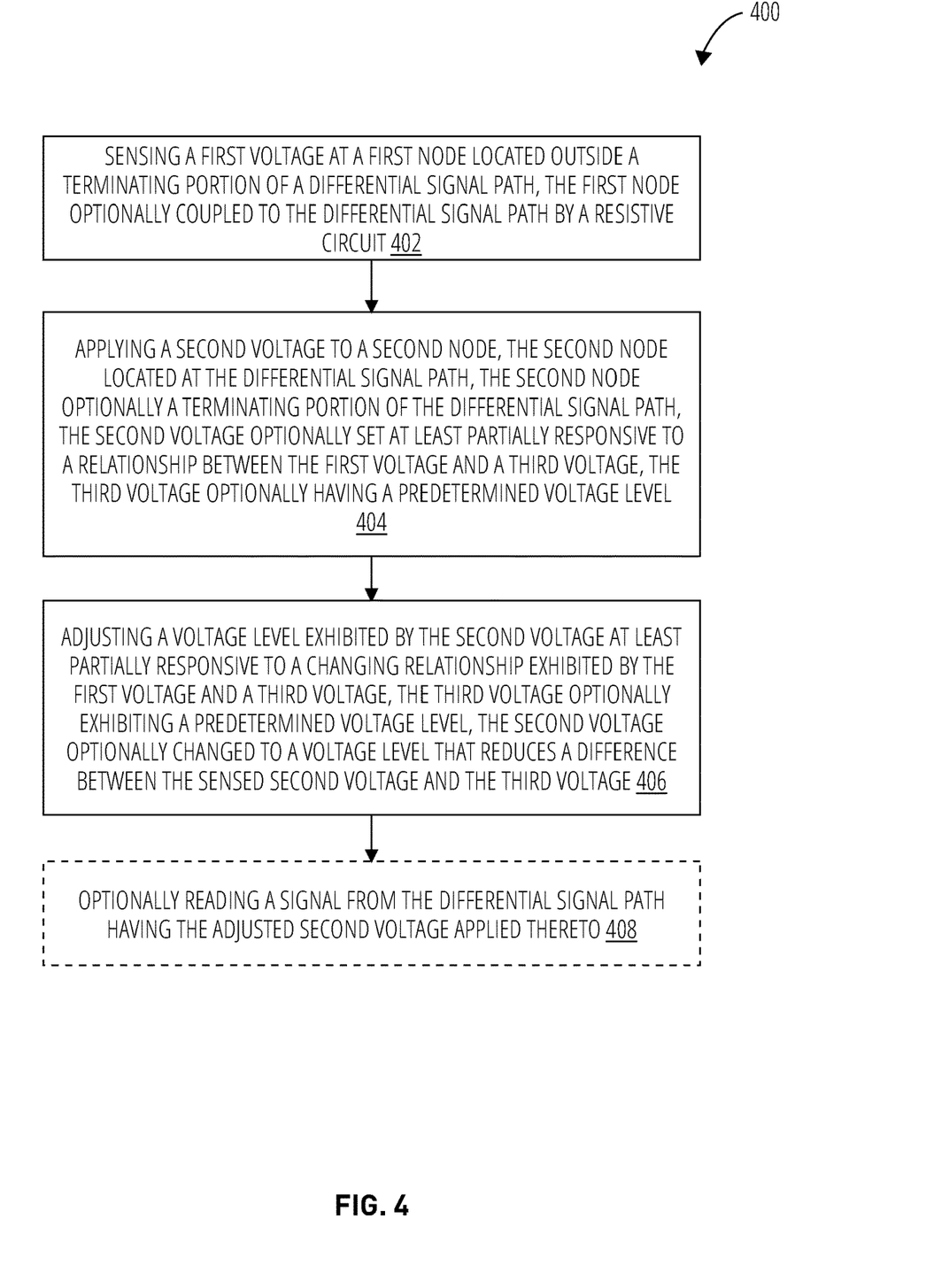
FIG. 4 is a flowchart depicting a process for suppressing the influence of common-mode transient events on a signal read from a differential transmission system, in accordance with one or more examples.

FIG. 4 is a flowchart depicting a process 400 to isolate a common-mode impedance and a differential impedance in accordance with one more examples. The common-mode impedance may be reduced relative to the differential impedance. Reducing common-mode impedance relative to differential impedance may reduce influence of common-model signals on read signals relative to the influence of differential signals, increasing signal to noise ratio (SNR) and improving detection of an information signal transmitted as a differential signal.

At operation 402, process 400 senses a first voltage (e.g., common-mode voltage $V_{CM}$) at a first node (e.g., sensing node 112, without limitation) located outside a terminating portion of a differential signal path (e.g., a differential signal path portion 102, without limitation). Optionally, the sensing node may be coupled to the terminating portion of the differential signal path by a resistive circuit (e.g., a circuit including resistors R3 and R4 of FIG. 1, without limitation). In some cases, the first voltage may be a common-mode signal, or component thereof, induced at the differential signal path, as a non-limiting example, by electrical events such as voltage spikes or other transients.

At operation 404, process 400 applies a second voltage (e.g., common-mode suppression voltage $V_{CMS}$ of FIG. 1, without limitation) to a second node (e.g., terminating node 110 of FIG. 1, without limitation), the second node located at the differential signal path. Optionally, the second node is located at the terminating portion of the differential signal path (e.g., at terminating node 110, without limitation). The second voltage is optionally set at least partially responsive to a relationship between the first voltage and a third voltage (e.g., the reference voltage $V_{REF}$, without limitation), the third voltage optionally having a predetermined voltage level. The relationship between the first voltage and the third voltage may change, for example, at least partially responsive to the second voltage.

At operation 406, process 400 adjusts a voltage level exhibited by the second voltage at least partially responsive to a relationship between the first voltage and a third voltage (e.g., reference voltage $V_{REF}$ of FIG. 1, without limitation). In one or more examples, the relationship may be a difference between respective voltage levels of the first voltage and the third voltage (e.g., between common-mode voltage $V_{CM}$ and reference voltage $V_{REF}$ of FIG. 1, without limitation). The third voltage may optionally exhibit a predetermined voltage level. In one or more examples, process 400 optionally changes a voltage level exhibited by the second voltage in a manner that reduces a difference between the sensed second voltage and the third voltage (e.g., reduces a difference between common-mode voltage $V_{CM}$ and the reference voltage $V_{REF}$, without limitation).

At optional operation 408, process 400 optionally reads a differential signal from the differential signal path. The differential signal is read while applying the second voltage to the differential signal path.

Figure 5:
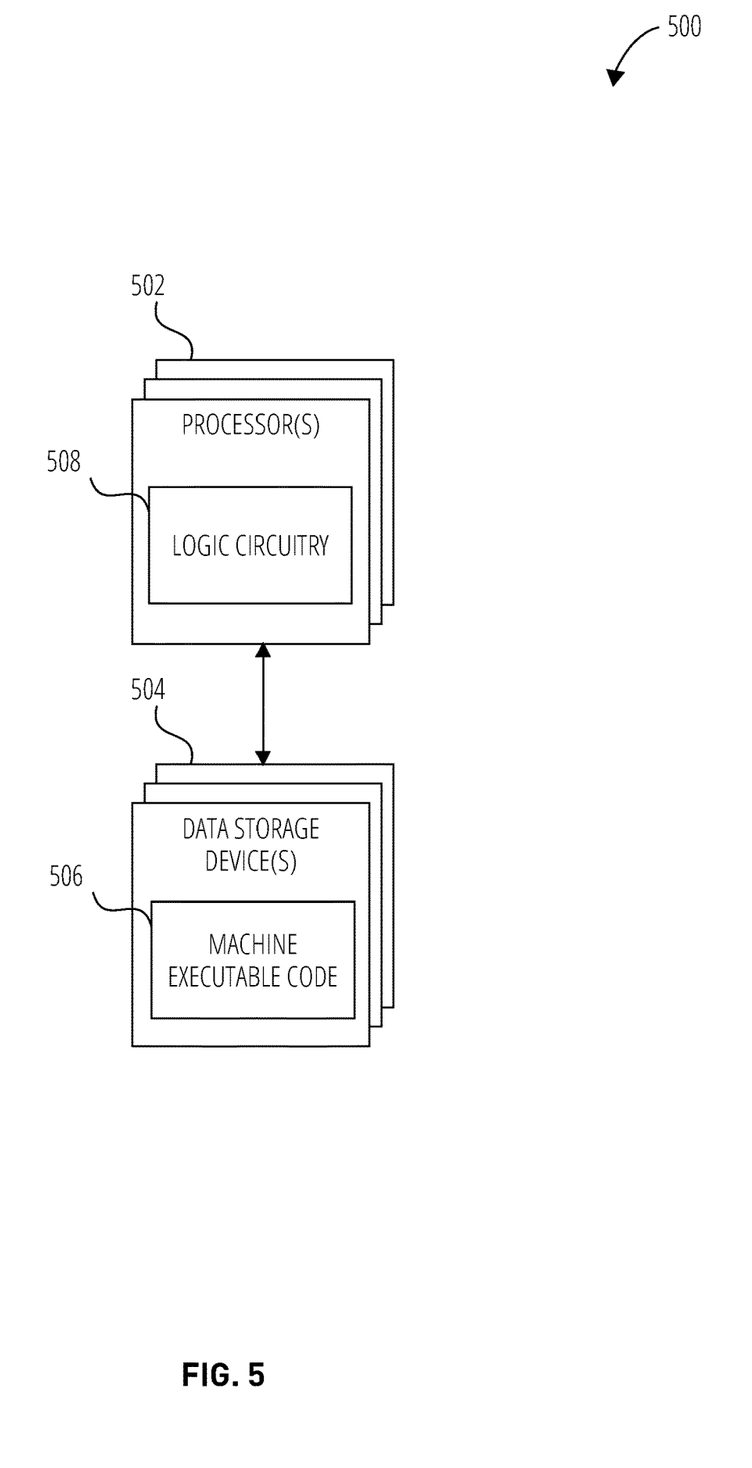
FIG. 5 is a block diagram of circuitry that may be used to implement various functions, operations, acts, processes, and/or methods disclosed herein, in accordance with one or more examples.

It will be appreciated by those of ordinary skill in the art that functional elements of examples disclosed herein (e.g., functions, operations, acts, processes, and/or methods) may be implemented in any suitable hardware, software, firmware, or combinations thereof. FIG. 5 illustrates non-limiting examples of implementations of functional elements disclosed herein. In some examples, some or all portions of the functional elements disclosed herein may be performed by hardware specially configured for carrying out the functional elements.

FIG. 5 is a block diagram of circuitry 500 that, in some examples, may be used to implement various functions, operations, acts, processes, and/or methods disclosed herein. The circuitry 500 includes one or more processors 502 (sometimes referred to herein as "processors 502") operably coupled to one or more data storage devices (sometimes referred to herein as "storage 504"). The storage 504 includes machine executable code 506 stored thereon and the processors 502 include logic circuitry 508. The machine executable code 506 includes information describing functional elements that may be implemented by (e.g., performed by) the logic circuitry 508. The logic circuitry 508 is adapted to implement (e.g., perform) the functional elements described by the machine executable code 506. The circuitry 500, when executing the functional elements described by the machine executable code 506, should be considered as special purpose hardware configured for carrying out functional elements disclosed herein. In some examples the processors 502 may be configured to perform the functional elements described by the machine executable code 506 sequentially, concurrently (e.g., on one or more different hardware platforms), or in one or more parallel process streams.

When implemented by logic circuitry 508 of the processors 502, the machine executable code 506 is configured to adapt the processors 502 to perform operations of examples disclosed herein, for example discussed with respect to apparatus 100 of FIG. 1, system 200 of FIG. 2, system 300 of FIG. 3, and combinations and subcombinations thereof. For example, the machine executable code 506 may be configured to adapt the processors 502 to perform at least a portion or a totality of the functions described for differential signal path portion 102, first circuit 104 or second circuit 106; receiver 220 or second isolator 210; receiver 312, a transmitter 308, or isolator 306; terminating portion 310, differential transmission line 318, a differential detector 302, or impedance isolator 304. For example, the machine executable code 506 may be configured to adapt the processors 502 to perform at least a portion or a totality of the process 400 of FIG. 4.

As a specific non-limiting example, the machine executable code 506 may be configured to adapt the processors 502 to isolate a common-mode impedance from a differential impedance. As another specific non-limiting example, the machine executable code 506 may be configured to adapt processors 502 to suppress common-mode signals induced at a differential transmission system including when a differential signal is read from terminals of a receiver of a differential transmission system.

The processors 502 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine executable code 506 (e.g., software code, firmware code, hardware descriptions) related to examples of the present disclosure. It is noted that a general-purpose processor (may also be referred to herein as a host processor or simply a host) may be a microprocessor, but in the alternative, the processors 502 may include any conventional processor, controller, microcontroller, or state machine. The processors 502 may also be implemented as a combination of computing devices, such as a combination of a DSP and a microprocessor, a plurality of microprocessors, one or more microprocessors in conjunction with a DSP core, or any other such configuration.

In some examples the storage 504 includes volatile data storage (e.g., random-access memory (RAM)), non-volatile data storage (e.g., Flash memory, a hard disc drive, a solid state drive, erasable programmable read-only memory (EPROM), etc.). In some examples the processors 502 and the storage 504 may be implemented into a single device (e.g., a semiconductor device product, a system on chip (SOC), etc.). In some examples the processors 502 and the storage 504 may be implemented into separate devices.

In some examples the machine executable code 506 may include computer-readable instructions (e.g., software code, firmware code). By way of non-limiting example, the computer-readable instructions may be stored by the storage 504, accessed directly by the processors 502, and executed by the processors 502 using at least the logic circuitry 508. Also by way of non-limiting example, the computer-readable instructions may be stored on the storage 504, transferred to a memory device (not shown) for execution, and executed by the processors 502 using at least the logic circuitry 508. Accordingly, in some examples the logic circuitry 508 includes electrically configurable logic circuitry 508.

In some examples the machine executable code 506 may describe hardware (e.g., circuitry) to be implemented in the logic circuitry 508 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG, SYSTEM VERILOG or very large scale integration (VLSI) hardware description language (VHDL) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 508 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples the machine executable code 506 may include an HDL, an RTL, a GL description, a mask level description, other hardware description, or any combination thereof.

In examples where the machine executable code 506 includes a hardware description (at any level of abstraction), a system (not shown, but including the storage 504) may be configured to implement the hardware description described by the machine executable code 506. By way of non-limiting example, the processors 502 may include a programmable logic device (e.g., an FPGA or a PLC) and the logic circuitry 508 may be electrically controlled to implement circuitry corresponding to the hardware description into the logic circuitry 508. Also by way of non-limiting example, the logic circuitry 508 may include hard-wired logic manufactured by a manufacturing system (not shown, but including the storage 504) according to the hardware description of the machine executable code 506.

Regardless of whether the machine executable code 506 includes computer-readable instructions or a hardware description, the logic circuitry 508 is adapted to perform the functional elements described by the machine executable code 506 when implementing the functional elements of the machine executable code 506. It is noted that although a hardware description may not directly describe functional elements, a hardware description indirectly describes functional elements that the hardware elements described by the hardware description are capable of performing.

While specific examples discussed herein may include unidirectional communication, it should be understood that bidirectional communication and devices configurable to be transmitters, receivers, or both transmitters and receivers, do not exceed the scope of this disclosure.

A person having ordinary skill in the art would appreciate many advantages and applications for disclosed common-mode impedance isolators and receivers and transmission systems implementing the same. As a non-limiting example, a differential transmission system implementing common-mode impedance isolation may operate in the presence of common-mode transient events without such events substantially degrading a differential signal. In a noisy environment, such as one implementing high speed switching discussed herein, fewer errors may be realized in the signaling (e.g., because noise does not dominate the read signal, without limitation).

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means some or a totality. As used herein, the term "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

Additional non-limiting examples of the disclosure include:

Example 1: An apparatus, comprising: a differential signal path portion; a first circuit arranged at the differential signal path portion to set a differential impedance of the differential signal path portion; and a second circuit arranged outside of the differential signal path portion to set a common-mode impedance of the differential signal path portion lower than the differential impedance.

Example 2: The apparatus according to Example 1, wherein the first circuit comprises: a first resistor coupled between a first terminal of the differential signal path portion and a terminating node to form a first component portion of the differential signal path; and a second resistor coupled between a second terminal of the differential signal path portion and the terminating node to form a second component portion of the differential signal path.

Example 3: The apparatus according to Examples 1 and 2, wherein the second circuit comprises: a pair of resistors coupled between different component portions of the differential signal path portion and a sensing node to locate the sensing node outside the differential signal path portion.

Example 4: The apparatus according to any of Examples 1 to 3, wherein the second circuit comprises: an amplifier coupled to sense a voltage at the sensing node and to apply a voltage to a terminating node of the differential signal path portion at least partially responsive to a relationship between the sensed voltage and a reference voltage.

Example 5: The apparatus according to any of Examples 1 to 4, wherein the reference voltage has a predetermined voltage level.

Example 6: An apparatus, comprising: a terminating portion of a differential transmission line; a differential detector to read a signal received via the differential transmission line; and an impedance isolator to apply a termination impedance at the terminating portion of the differential transmission line, wherein the termination impedance comprises a differential impedance and a common-mode impedance that is different than the differential impedance.

Example 7: The apparatus according to Example 6, wherein the isolator comprises: a first circuit arranged to apply the differential impedance to the terminating portion of the differential transmission line; and a second circuit arranged to apply the common-mode impedance to the terminating portion of the differential transmission line.

Example 8: The apparatus according to Examples 6 and 7, wherein the first circuit comprises: a first resistor coupled between a first terminal of the terminating portion and a terminating node to form a first component portion of the differential transmission line; and a second resistor coupled between a second terminal of the terminating portion and the terminating node to form a second component portion of the differential transmission line.

Example 9: The apparatus according to any of Examples 6 to 8, wherein the second circuit comprises: a pair of resistors coupled between different component portions of the terminating portion and a sensing node to locate the sensing node outside the terminating portion.

Example 10: The apparatus according to any of Examples 6 to 9, wherein the second circuit comprises: an amplifier coupled to sense a voltage at the sensing node and to apply a voltage to a terminating node of terminating portion at least partially responsive to a relationship between the sensed voltage and a reference voltage.

Example 11: A method, comprising: sensing a first voltage at a first node located outside a terminating portion of a differential signal path; applying a second voltage to a second node located at the terminating portion of the differential signal path at least partially responsive to a relationship between the first voltage and a third voltage; adjusting the second voltage at least partially responsive to a changing relationship exhibited by the first voltage and the third voltage; and reading a signal from the terminating portion of the differential signal path having the adjusted second voltage applied thereto.

Example 12: The method according to Example 11, wherein the first node is coupled to the terminating portion of the differential signal path by a resistive circuit.

Example 13: The method according to Examples 11 and 12, wherein the second node is a terminating node of the terminating portion of the differential signal path.

Example 14: The method according to any of Examples 11 to 13, wherein the third voltage exhibiting a predetermined voltage level.

Example 15: The method according to any of Examples 11 to 14, wherein the second voltage is proportional to a common-mode signal of the differential signal path.

Example 16: A system, comprising: a support structure; a first electronic subsystem and a second electronic subsystem arranged on the support structure; a first isolator arranged on the support structure at a location between the first electronic subsystem and the second electronic subsystem, the first isolator to reduce an influence of an electrical environment of the first or second electronic subsystems on an operation of another of the first or second electronic subsystems; a differential transmission system coupled to the first electronic subsystem and to the second electronic subsystem; and a second isolator to reduce the influence of the electrical environment of the first electronic subsystem on a signal transmitted by the differential transmission system.

Example 17: The system according to Example 16, wherein the support structure is to provide continuous electrical and mechanical support to the first and second electronic subsystems and the isolator.

Example 18: The system according to Examples 16 and 17, wherein a differential transmission medium of the differential transmission system is exposed to transient electrical events experienced at the electrical environment of the first electronic subsystem, wherein the transient electrical events are sufficient to increase common-mode voltage at the differential transmission medium above a threshold of the second electronic subsystem.

What is claimed is:
1. An apparatus, comprising:
a differential signal path portion;
a first circuit arranged at the differential signal path portion to set a differential impedance of the differential signal path portion; and
a second circuit arranged outside of the differential signal path portion to set a common-mode impedance of the differential signal path portion lower than the differential impedance.
2. An apparatus, comprising:
a differential signal path portion;
a first circuit arranged at the differential signal path portion to set a differential impedance of the differential signal path portion, wherein the first circuit comprises:
a first resistor coupled between a first terminal of the differential signal path portion and a terminating node to form a first component portion of the differential signal path portion; and
a second resistor coupled between a second terminal of the differential signal path portion and the terminating node to form a second component portion of the differential signal path portion, and
a second circuit arranged outside of the differential signal path portion to set a common-mode impedance of the differential signal path portion lower than the differential impedance.
3. An apparatus, comprising:
a differential signal path portion;
a first circuit arranged at the differential signal path portion to set a differential impedance of the differential signal path portion; and
a second circuit arranged outside of the differential signal path portion to set a common-mode impedance of the differential signal path portion lower than the differential impedance, wherein the second circuit comprises:
a pair of resistors coupled between different component portions of the differential signal path portion and a sensing node to locate the sensing node outside the differential signal path portion.
4. The apparatus of claim 3, wherein the second circuit comprises:
an amplifier coupled to sense a voltage at the sensing node and to apply a voltage to a terminating node of the differential signal path portion at least partially responsive to a relationship between the sensed voltage and a reference voltage.

5. The apparatus of claim 4, wherein the reference voltage has a predetermined voltage level.

6. The apparatus of claim 3, wherein the second circuit comprises:
an amplifier, the amplifier having:
an inverting input operably coupled with the sensing node;
a non-inverting input operably coupled with a voltage reference; and
an output operably coupled with a terminating node of the first circuit.

7. The apparatus of claim 6, wherein a feedback path between the output of the amplifier and the inverting input of the amplifier includes the first circuit and the pair of resistors of the second circuit.

8. The apparatus of claim 6, wherein the differential signal path portion is operably coupled with a transmission system, wherein the voltage reference to provide a voltage that exhibits a voltage level substantially equal to a mid-point of an operating voltage range of the transmission system.

9. An apparatus, comprising:
a terminating portion of a differential transmission line;
a differential detector to read a signal received via the differential transmission line; and
an impedance isolator to apply a termination impedance at the terminating portion of the differential transmission line,
wherein the termination impedance comprises a differential impedance and a common-mode impedance that is different than the differential impedance.

10. The apparatus of claim 6, wherein the isolator comprises:
a first circuit arranged to apply the differential impedance to the terminating portion of the differential transmission line; and
a second circuit arranged to apply the common-mode impedance to the terminating portion of the differential transmission line.

11. The apparatus of claim 10, wherein the first circuit comprises:
a first resistor coupled between a first terminal of the terminating portion and a terminating node to form a first component portion of the differential transmission line; and
a second resistor coupled between a second terminal of the terminating portion and the terminating node to form a second component portion of the differential transmission line.

12. The apparatus of claim 10, wherein the second circuit comprises:
a pair of resistors coupled between different component portions of the terminating portion and a sensing node to locate the sensing node outside the terminating portion.

13. The apparatus of claim 10, wherein the second circuit comprises:
an amplifier coupled to sense a voltage at a sensing node and to apply a voltage to a terminating node of terminating portion at least partially responsive to a relationship between the sensed voltage and a reference voltage.

14. A method, comprising:
sensing a first voltage at a first node located outside a terminating portion of a differential signal path;
applying a second voltage to a second node located at the terminating portion of the differential signal path at least partially responsive to a relationship between the first voltage and a third voltage;
adjusting the second voltage at least partially responsive to a changing relationship exhibited by the first voltage and the third voltage; and
reading a signal from the terminating portion of the differential signal path having the adjusted second voltage applied thereto.

15. The method of claim 14, wherein the first node is coupled to the terminating portion of the differential signal path by a resistive circuit.

16. The method of claim 14, wherein the second node is a terminating node of the terminating portion of the differential signal path.

17. The method of claim 14, wherein the third voltage exhibiting a predetermined voltage level.

18. The method of claim 14, wherein the second voltage is proportional to a common-mode signal of the differential signal path.

* * * * *